(12) United States Patent
Qiao et al.

(10) Patent No.: US 9,741,533 B2
(45) Date of Patent: Aug. 22, 2017

(54) IMAGE TYPE ELECTRON SPIN POLARIMETER

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Shan Qiao, Shanghai (CN); Weishi Wan, Shanghai (CN); Fuhao Ji, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 14/906,254

(22) PCT Filed: Sep. 10, 2013

(86) PCT No.: PCT/CN2013/083207
§ 371 (c)(1),
(2) Date: Jan. 19, 2016

(87) PCT Pub. No.: WO2015/010356
PCT Pub. Date: Jan. 29, 2015

(65) Prior Publication Data
US 2016/0172157 A1  Jun. 16, 2016

(30) Foreign Application Priority Data

Jul. 24, 2013 (CN) .......................... 2013 1 0313572

(51) Int. Cl.
*H01J 37/29* (2006.01)
*H01J 37/147* (2006.01)
(Continued)

(52) U.S. Cl.
CPC ............ *H01J 37/29* (2013.01); *H01J 37/147* (2013.01); *H01J 37/244* (2013.01);
(Continued)

(58) Field of Classification Search
CPC ........ H01J 37/29; H01J 37/244; H01J 37/147; H01J 2237/2544; H01J 2237/24557
(Continued)

(56) References Cited

U.S. PATENT DOCUMENTS 6,583,410 B1 * 6/2003 Seddon ...................... G01T 1/32
250/305
6,639,218 B2   10/2003 Mukasa et al.
(Continued)

FOREIGN PATENT DOCUMENTS

CN    1322004 A    11/2001
CN    1336542 A    2/2002
(Continued)

*Primary Examiner* — Nicole Ippolito
(74) *Attorney, Agent, or Firm* — Global IP Services; Tianhua Gu

(57) ABSTRACT

Provided is an image type electron spin polarimeter. It at least comprises a scattering target, a two-dimensional electron detector and an electron bending unit, wherein the electron bending unit is used for bending the orbit of the incident (scattered) electrons to a first (second) angle to arrive the scattering target (two-dimensional electron detector) with an optimal incident angle, and to transfer the image of the electron intensities from the entrance plane (scattering target) to the scattering target (two-dimensional electron detector) with small aberrations, and to separate the orbits of incident and scattered electrons to increase the degree of freedom of the geometric configuration of each component of the spin polarimeter. At least one of the first and second angles is not 0°, thereby achieving the first transfer of the two-dimensional image of electron intensities on the entrance plane to the scattering target and the second transfer (Continued)

from scattering target to the two-dimensional electron detector respectively with small aberrations, and then achieving multichannel measurements of the electron spin.

15 Claims, 3 Drawing Sheets

(51) Int. Cl.
  *H01J 37/244* (2006.01)
  *H01J 37/252* (2006.01)
(52) U.S. Cl.
  CPC ... *H01J 37/252* (2013.01); *H01J 2237/24557* (2013.01); *H01J 2237/2544* (2013.01)
(58) Field of Classification Search
  USPC .................... 250/305, 306, 307, 396 R, 397
  See application file for complete search history.

(56) References Cited

U.S. PATENT DOCUMENTS

| | | | |
|---|---|---|---|
| 6,674,073 | B2 | 1/2004 | Mukasa et al. |
| 2002/0003213 | A1* | 1/2002 | Mukasa ................ H01J 37/252 250/310 |
| 2008/0217533 | A1* | 9/2008 | Kohashi ............. G01N 23/2251 250/310 |
| 2012/0223294 | A1* | 9/2012 | Gohler .................. B82Y 10/00 257/40 |
| 2013/0126727 | A1* | 5/2013 | Jozwiak ................ H01J 49/446 250/305 |

FOREIGN PATENT DOCUMENTS

| | | |
|---|---|---|
| CN | 101038330 A | 9/2007 |
| JP | 2007087954 A | 4/2007 |

* cited by examiner

IMAGE TYPE ELECTRON SPIN POLARIMETER

CROSS REFERENCE TO RELATED PATENT APPLICATION

The present application is the US national stage of PCT/CN2013/083207 filed on Sep. 10, 2013 which claims the priority of CN201310313572.0 filed on Jul. 24, 2013 which application is incorporated herein by reference.

FIELD OF INVENTION

The present invention relates to the field of electron spin analysis, in particular to an image type electron spin polarimeter.

DESCRIPTION OF RELATED ART

Currently, devices for measuring electron spin mainly include Mott, spin-LEED and VLEED polarimeters. According to the operational mechanism of the Mott polarimeter, electrons are first accelerated to a kinetic energy of 20-100 keV, and are then scattered off a high Z element target with high spin-orbit interaction. The spin of the incident electrons is measured from the asymmetry of intensities of the scattered electrons to the left and right sides. Measurement of the electron spin using a spin-LEED polarimeter is performed by measuring the asymmetry of the intensities of the diffraction spots of the electrons from a W (100) single crystal surface. The VLEED polarimeter is a recently developed novel device. The operational mechanism of the VLEEP polarimeter involves firstly accelerating (or decelerating) electrons to kinetic energy of 6 eV, then measuring reflectivities of the electrons scattered by a Fe (001)-p (1×1) O target with magnetization along the +Z and -Z directions respectively. The spin of the incident electrons along Z direction can be measured by the relative difference of the two reflectivities. At present, the VLEED polarimeter has the highest efficiency.

A schematic diagram of the current VLEED polarimeter is shown in FIG. 1. Electrons at point a on plane 11 go to scattering target 13 through electron lens 12, and the scattered electrons arrive at point A on an electron detector 15 though an electron lens 14. Similarly, incident electrons at point b arrive at point B though a similar route. If the electrons go to scattering target 13 with a normal incident angle, scattered electrons also exit at a normal angle to scattering target 13. The incident beam will be obviously blocked by the detector, thus the glazing incidence geometry is necessary for the current VLEED spin polarimeter. Since the efficiency of the VLEED decreases with the increase in the incident angle, the angle between the electron beam and the normal of the scattering target, a relatively small incident angle is required. However, by considering the sizes of electron lenses 12 and 14, the incident angle cannot be very small, and thus a 7° incident angle is usually selected as shown in FIG. 1. Since the incident angle is not zero, the orbit of the incident electrons differs from that of the scattered electrons, and the same electron lens cannot be adopted for both incident and scattered electrons. Because of the geometric constraint, the size of the electron lenses 12 and 14 cannot be large, which results in a large aberration, where incident electrons from the same point a will form a relatively large beam spot centered around point A. Similarly, incident electrons from point b will form a relatively large beam spot centered around point B. Since the beam spots are relatively large, the beam spot centered around point A will be partially overlapped with that centered around point B and the current VLEED polarimeter is unable to distinguish the source locations of the incident electrons on the entrance plane 11. That is, the polarimeter is unable to distinguish whether an incident electron is from point a or b. A polarimeter that fails to distinguish between the source locations on the entrance plane is called a single channel polarimeter and one that can differentiate between the source locations is called a multichannel or image type polarimeter. Currently available electron spin polarimeters are almost all single channel. It has always been a focus of attention for scientific and technical staff to realize multichannel measurement of the electron spin to improve the efficiency of the electron spin measurements.

Currently, the only reported multichannel electron spin polarimeter created by Kirschner group in Germany is based on spin-LEED type. The incident electrons to the polarimeter are deflected by a W (100) target with a 45° incident angle. A 90° angle is formed between the incident and scattered electron beam. Since both the virtual image plane formed by the incident electrons on the back of the W (100) target and the real image plane are perpendicular to the optical axis of the electrons, the electron optical system has a relative small aberration, and the source locations of the incident electrons can be differentiated accordingly. However, the spin-LEED analyzer performs the electron spin measurements based on the spin-orbit interactions. The efficiency of the analyzer is merely one-tenth of the VLEED analyzer based on strong correlations. Also, since the W (100) target adopted for the spin-LEED polarimeter cannot be magnetized, the measurements of electron spin are carried out by the difference in reflectivities when the sample is magnetized successively along two different directions. Since magnetization of the sample is required, it is only applicable for ferromagnetic samples. However, research on the spin of electrons in a non-ferromagnetic sample with spin-orbit coupling has become a frontier field in condensed matter physics and a multichannel electron spin polarimeter based on other principles is urgently required.

SUMMARY OF THE PRESENT INVENTION

In view of the above disadvantages in the prior art, the object of the present invention is to provide a universal and more efficient image type electron spin polarimeter to achieve multichannel measurements of the electron spin.

To achieve the above objective and other related tasks, the present invention provides an image type electron spin polarimeter comprising a scattering target, a two-dimensional electron detector and an electron bending unit. The electron bending unit is used for bending the orbit of the incident electrons to the first angle to arrive at the scattering target with an optimal incident angle, and to transfer the image of the electron intensities from the entrance plane to the scattering target. It is also used for bending the orbit of scattered electrons from the scattering target to a second angle to arrive at the two-dimensional electron detector with an optimal incident angle, and to transfer the image of the electron intensities from the scattering target to the two-dimensional electron detector. The orbits of the incident and scattered electrons are separated from each other, and at least one of the first angle or the second angle is not 0°.

Preferably, the electron bending unit enables the orbit of scattered electrons from the scattering target to be bent at a certain second angle and the electrons reach the two-dimensional electron detector with normal incidence. It is preferable that the second angle is in the range of [0°, 180°].

Preferably, the electron bending unit that enables the orbit of incident electrons to be bent at a certain first angle and the electrons reach the scattering target with a normal incidence. It is preferable that the first angle is in the range of [0°, 180°].

Preferably, the electron bending unit comprises a magnetic field generation unit for generating magnetic fields and an electron lens system ; more preferably, the electron lens to transfer the incident electrons from the magnetic field to the scattering target is the same one to transfer the scattered electrons from the scattering target back to the magnetic field. Preferably, the magnetic field generation unit comprises a main dipole magnet and if needed some correcting magnets to correct the edge effects of the main dipole magnet and to focus the electron beam in the perpendicular direction relative to the electron orbital plane.

Preferably, the scattering target comprises a Fe (001)–p (1×1) O target or a W(100) target.

From the above, the image type electron spin polarimeter of the present invention has following beneficial effects: the orbits of the incident and scattered electrons are separated by the magnetic field, thereby avoiding the difficulty in geometric arrangements of the electron lens and the electron detector, and enabling the electron lens system to have a relatively large size to obtain a relatively small aberration; also, it can be guaranteed that the entrance plane, the target plane and the electron detector are all perpendicular to the electron optical axis, so a real two-dimensional imaging type with small aberration can be achieved, which results in a large number of channels for the measurements of electron spin.

Figure 1:
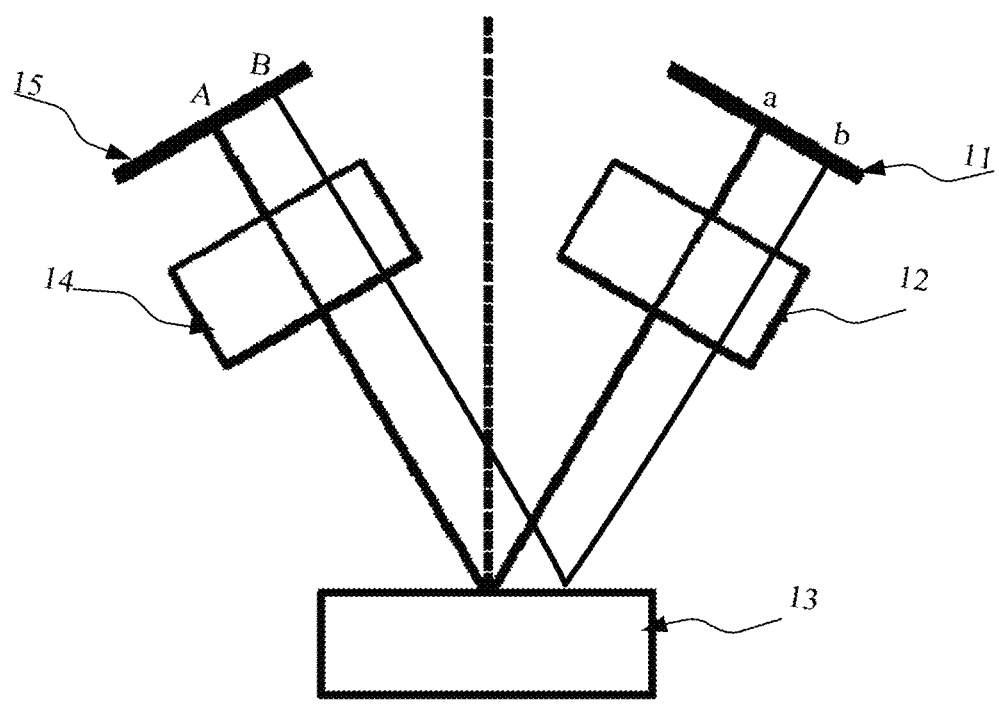
FIG. 1 shows a schematic diagram of the measurement principle of the electron spin of an existing VLEED detector.

11 entrance plane
12, 14 electron lens
13 scattering target
15 electron detector
2, 2' entrance plane
31, 32, 33 electron lens
31', 32', 33' electron lens
4, 4' scattering target
5, 5' two-dimensional electron detector
61, 61' main dipole magnet
62, 62', 63', 64' correction magnets

DETAILED DESCRIPTION OF THE PREFERRED EMBODIMENTS

The embodiment modes of the present invention are described through specific examples, and skilled persons may easily understand other advantages and efficacies of the present invention from the contents disclosed in the present description.

Figure 2:
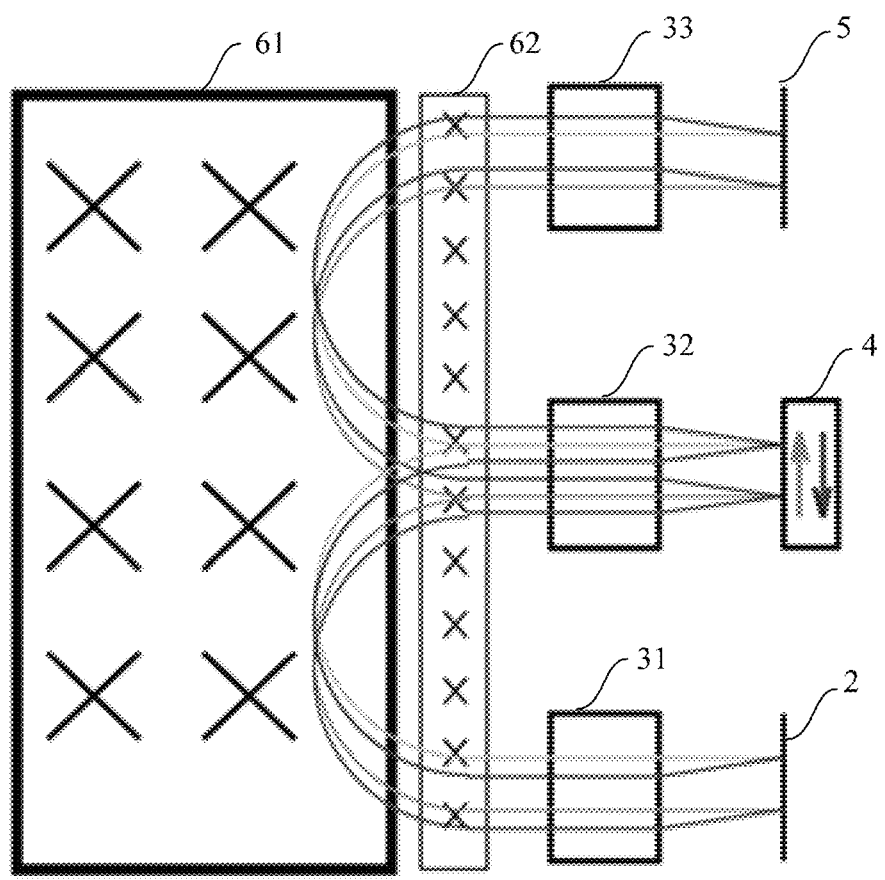
FIG. 2 shows a schematic diagram of the electron orbits of a preferable arrangement of the present invention.
Figure 3:
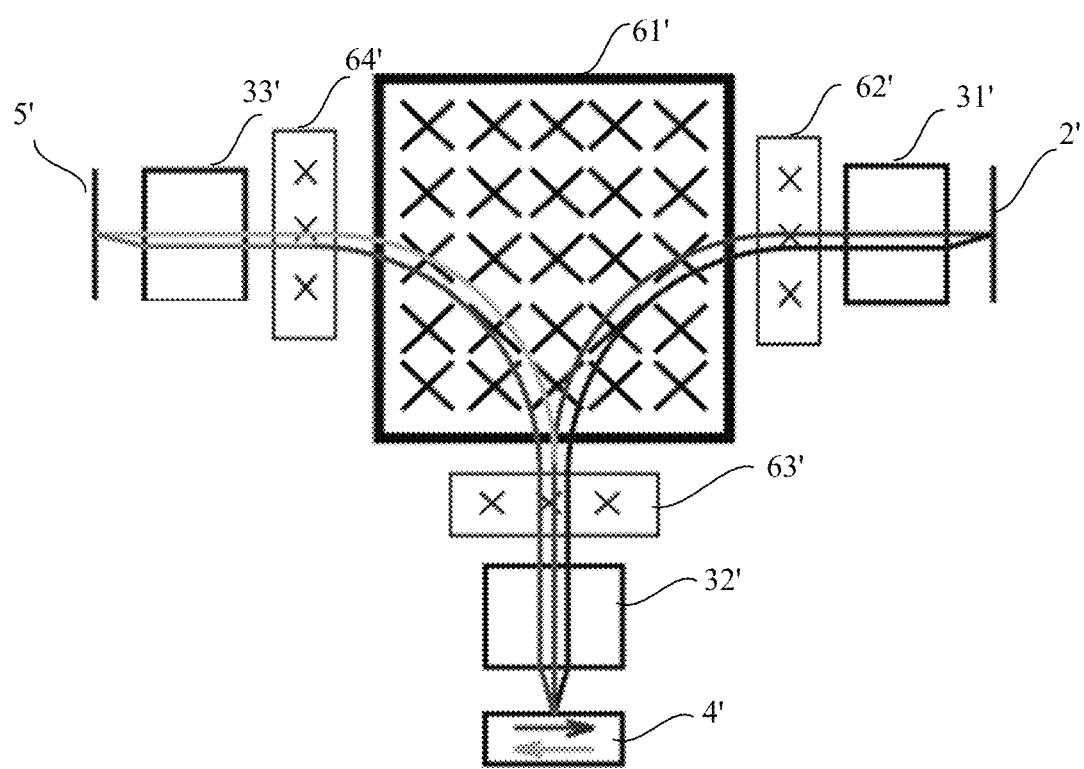
FIG. 3 shows a schematic diagram of the electron orbits of another preferable arrangement of the present invention.

Please refer to FIG. 2 and to FIG. 3. It should be noted that the structure, scale, and size shown in the drawings attached to this document are only used to explain the content exposed by the document for a skilled person, but not used to limit qualifications when the invention may be implemented. Thus any modification of structure, alteration of the proportional relations, or modulation of the size without technical essential meanings shall fall into the covered scope by the disclosed technical solution of the invention. Terms such as "up", "down", "left", "right" and the like cited in this document are also only for clarity of the description but are not used to limit the scope of the invention. A change or adjustment of the relative relation should also be treated in the scope of the invention when there is no substantial alteration in the technical content.

The present invention provides an image type electron spin polarimeter. The image type electron spin polarimeter comprises a scattering target, a two-dimensional electron detector and an electron bending unit.

The scattering target is a device to scatter the electrons and preferably comprises, but is not limited to, a Fe (001)–p (1×1)O target or a W(100) target.

The two-dimensional electron detector is a device for recording the two-dimensional distribution of the electron densities. A commonly used two-dimensional electron detector is composed of a microchannel plate (MCP), a fluorescent screen and a high sensitive camera; another kind of commonly used two-dimensional electron detector is composed of a microchannel plate (MCP) and a delay line detector (DLD).

The electron bending unit is a unit that enables the incident electrons to move in a curved orbit with a first bending angle to arrive at the scattering target with a normal incident angle and transfer the electron intensity image on the entrance plane to the scattering target with small aberrations. It also enables the scattered electrons from the scattering target to move in a curved orbit with a second bending angle to arrive at the two dimensional electron detector with a normal incident angle and transfer the electron intensity image on the scattering target to the two-dimensional electron detector with small aberrations. The orbits of the incident and scattered electrons are separated from each other by the magnetic field, and at least either the first bending angle or the second bending angle is not 0°.

If a Fe (001)–p (1×1)O target is adopted, the optimal incidence angle is 0°, that is, the incident electron beam arrives the Fe (001)–p (1×1)O target with a normal incident angle, and also the orbit of the scattered electron beam needs to be bent by the second bending angle. The electron beam arrives at the two-dimensional electron detector with a normal incident angle, namely the center line of the electron beam is perpendicular to the detector plane.

Both the first bending angle and the second bending angle are determined by the locations of the scattering target, the two-dimensional electron detector and the entrance plane. Preferably, both the first bending angle and the second bending angle are in the range of [0°, 180°], but cannot be 0° simultaneously.

Preferably, the electron bending unit comprises a magnetic field generation unit for generating magnetic fields and an electron lens system.

For example, as shown in FIG. 2, the electron bending unit comprises a magnetic field generation unit and electron lenses 31, 32, and 33. The magnetic field generation unit comprises a main dipole magnet 61 and a correcting magnet 62 to correct the edge effects and to focus the electron beam in the direction perpendicular to the orbital plane. The entrance plane 2, scattering target 4 and the two-dimensional electron detector 5 are in the focal planes of the electron lens 31, 32 and 33, respectively. Scattering target 4, the two-dimensional electron detector 5 and entrance plane 2 are all located on the same side of the correction magnet 62. By passing through lens 31 and the magnetic field region generated by the magnetic field generation unit, the incident electrons from the same point on the entrance plane become parallel and the orbit of the electron beam is bent by 180°. They are then focused again to scattering target 4 by lens 32 and arrive at scattering target 4 with a normal incident angle. Scattered electrons from scattering target 4 enter lens 32 again and become parallel, and the orbit of the scattered electrons is bent another 180° by the magnetic field. The electron beam is focused by lens 33 to the two-dimensional electron detector 5 and arrive at the detector with a normal incident angle.

Another example is shown in FIG. 3. The electron bending unit comprises a magnetic field generation unit and electron lens 31', 32', and 33'. The magnetic field generation unit comprises a main dipole magnet 61' and three correcting magnets 62', 63' and 64'. Entrance plane 2', scattering target 4' and the two-dimensional electron detector 5' are set on the focal planes of electron lens 31', 32' and 33', respectively. Scattering target 4', the two-dimensional electron detector 5' and the entrance plane 2' are located on different sides of the main dipole magnet 61'. After passing through lens 31', magnetic fields 62', 61' and 63', the incident electrons from the same point on the entrance plane 2' become parallel and the orbit is bent by 90°. They are then focused by an electron lens 32' to the scattering target 4' and arrive at the scattering target at a normal incident angle. After passing through lens 32' and magnetic fields 63', 61' and 64', the scattered electrons from scattering target 4' become parallel again and the orbit is bent by another 90°. They are focused to the two-dimensional electron detector 5' by electron lens 33' and arrive at the detector with a normal incidence.

It should be noted that the foregoing correction magnets are not only for the correction of edge effects of the main dipole magnet to generate an ideal uniform magnetic field, but are also capable of eliminating anisotropic focusing of the main dipole magnet. Also, the foregoing focus includes the case of focusing to infinity.

Skilled persons should understand that the foregoing is only illustrative, rather than being used to limit the present invention. Actually, any electron bending unit that can bend the orbit of incident electrons with the first angle arriving at the scattering target at an optimal incident angle, as well as bending the orbit of the scattered electrons from the scattering target with a second angle reaching the two-dimensional electron detector at an optimal incident angle shall still be covered by the claims of the present invention.

Hereinafter, the mechanism of the image type electron spin polarimeter of the present invention will be illustrated in detail by adopting the Fe (001)–p (1×1)O target.

As shown in FIG. 2, the Fe (001)–p (1×1)O target 4 is first magnetized in a certain direction, for example the +Z direction. After that, the incident electrons from entrance plane 2 of the image type electron spin polarimeter enter the magnetic field region generated by the electron bending unit through the electron lens 31. Under the action of the magnetic field, the orbit of the incident electrons are bent 180° upward and the electrons arrive at Fe (001)–p (1×1)O target 4 with a normal incident angle through the electron lens 32 afterwards, and two-dimensional imaged on the Fe (001)–p (1×1)O target 4; subsequently, scattered electrons from the Fe (001)–p (1×1)O target 4 enter the electron bending unit and their orbit is bent 180° upward again and the electrons reach the two-dimensional electron detector 5 with a normal incident angle through the electron lens 33 afterwards, and are again two-dimensional imaged on an entrance plane of the two-dimensional image electron detector 5. This two-dimensional image of the electron intensities is recorded by a sensitive camera behind the fluorescent screen.

Then, the Fe (001)–p (1×1)O target 4 is magnetized along the –Z direction, and another two-dimensional image of the electron intensities is recorded again.

Finally, the spin polarization of the incident electrons at each point on the entrance plane can be determined from the intensity difference at a corresponding pixel point of the two successively obtained images, which is proportional to the spin polarization of the incident electrons along the Z direction.

It can be seen that the magnetic field results in the separation of the orbits of the incident and scattered electrons. Since the entrance plane, the target plane and the two-dimensional electron detector are all perpendicular to the electron optical axis and the same electron lens 32 or 32' is used to transfer the incident electrons from the magnetic field to the target and to transfer the scattered electrons from the target to the magnetic field, an electron lens with a large size can be adopted and the aberration of the whole optical system can be greatly reduced. This results in a very small beam spot on the two-dimensional electron detector for electrons from the same point on entrance plane and the spots from different points on entrance plane do not overlap. Accordingly, each beam spot on the detector corresponds to a certain point on the entrance plane, that is, the source location of the incident electrons can be differentiated and thus the image type electron spin polarimeter of the present invention enables multichannel measurement of electron spin.

Based on the previously mentioned details, by our present invention, both VLEED and spin-LEED type multichannel electron spin polarimeter may be constructed by adopting the Fe (001)–p (1×1)O and W targets, respectively.

From the above, the image type electron spin polarimeter of the present invention bends the orbit of the electrons by adopting a magnetic field, which may realize separation of the orbits of the incident and scattered electrons and achieves optimal incident angles to both the scattering target and electron detectors, thereby enabling the transfer of the two-dimensional image of electron intensities from the entrance plane to the scattering target plane, and from the scattering target to the two-dimensional electron detector, to achieve multichannel measurements of electron spin. Since all the object and image planes in the two transfers are perpendicular to the electron optical axes, real two-dimensional imaging is achievable. Further, the introduction of the electron bending unit can increase the degree of freedom of the geometric configuration of each component of the spin polarimeter. It is to be noted that, herein, real two-dimensional imaging means that the image plane of the first transfer without considering aberration entirely superposes the target plane, and the image plane of the second transfer without considering aberration entirely superposes the plane of the two-dimensional electron detector.

Therefore, the present invention effectively overcomes a variety of disadvantages in the prior art and has high industrial utility value.

The abovementioned embodiments are only being used to illustratively describe the principle and efficacy of the present invention, rather than to limit the present invention. Any skilled person may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. An image type electron spin polarimeter comprising:
a scattering target, a two-dimensional electron detector and an electron bending unit;
wherein, the electron bending unit is used for:
bending orbits of incident electrons to a first angle to enable the incident electrons to arrive at the scattering target at an optimal incident angle and to transfer a first electron intensity image from an entrance plane to the scattering target;
bending orbits of scattered electrons to a second angle to enable the scattered electrons to arrive at the two-dimensional electron detector at an optimal emergence angle and to transfer a second electron intensity image from the scattering target to the two-dimensional electron detector;
separating orbits of the incident electrons and the scattered electrons; and
at least one of the first angle and the second angle is greater than 0°.

2. The image type electron spin polarimeter according to claim 1, wherein the electron bending unit enables the incident electrons to move in a curved orbit with the first bending angle to arrive at the scattering target with a normal incident angle and to transfer the first electron intensity image from the entrance plane to the scattering target with a small aberration.

3. The image type electron spin polarimeter according to claim 2, wherein the first bending angle in the range of [0° to 180°].

4. The image type electron spin polarimeter according to claim 3, wherein the first bending angle that is 180° or 90°.

5. The image type electron spin polarimeter according to claim 1, wherein the first bending angle in a range of [0° to 180°].

6. The image type electron spin polarimeter according to claim 5, wherein the first bending angle is 180° or 90°.

7. The image type electron spin polarimeter according to claim 1, wherein the electron bending unit enables the scattered electrons from the scattering target to move in a curved orbit with the second bending angle to arrive at the two-dimensional electron detector with a normal incident angle and transfer the second electron intensity image from the scattering target to the two dimensional electron detector with a small aberration.

8. The image type electron spin polarimeter according to claim 7, wherein the second angle is in a range of [0° to 180°].

9. The image type electron spin polarimeter according to claim 8, wherein the second angle is 180° or 90°.

10. The image type electron spin polarimeter according to claim 1, wherein the second angle is in a range of [0° to 180°].

11. The image type electron spin polarimeter according to claim 10, wherein the second angle is 180° or 90°.

12. The image type electron spin polarimeter according to claim 1, wherein the electron bending unit comprises a magnetic field generation unit for generating magnetic field and an electron lens system.

13. The image type electron spin polarimeter according to claim 12, wherein the electron lens system used for transferring the incident electrons from the magnetic field to the scattering target is also used for transferring the scattered electrons from the scattering target back to the magnetic field.

14. The image type electron spin polarimeter according to claim 12, wherein the magnetic field generation unit comprises a main dipole magnet and at least one of correcting magnet for correcting edge effects of the main dipole magnet and for focusing a electron beam in a perpendicular direction relative to a electron orbital plane.

15. The image type electron spin polarimeter according to claim 1, wherein the scattering target comprises a Fe (001)-p (1×1)O target or a W(100) target.

* * * * *